United States Patent
Shimai et al.

(10) Patent No.: US 6,423,139 B1
(45) Date of Patent: Jul. 23, 2002

(54) CHEMICAL LIQUID TREATMENT APPARATUS

(75) Inventors: Futoshi Shimai; Koichi Nagasawa; Junji Kutsuzawa, all of Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 09/153,590

(22) Filed: Sep. 15, 1998

(30) Foreign Application Priority Data

Sep. 16, 1997 (JP) ............................................. 9-250196
May 29, 1998 (JP) ........................................... 10-149733

(51) Int. Cl.[7] .......................... B05C 5/02; B05C 11/00; B05B 13/00; B05D 5/12
(52) U.S. Cl. ...................... 118/300; 118/305; 118/410; 118/631; 118/632; 118/602; 427/96
(58) Field of Search .............................. 118/52, 56, 220, 118/300, 305, 319, 320, 323, 629, 630, 631, 632, 728, 729, 410, 600, 602; 134/153, 907; 269/21; 274/128; 361/234; 427/240, 96

(56) References Cited

U.S. PATENT DOCUMENTS

| | | | |
|---|---|---|---|
| 4,932,353 A | * 6/1990 | Kawata et al. | 118/302 |
| 4,938,994 A | * 7/1990 | Choinski | 427/96 |
| 5,622,747 A | * 4/1997 | Todd et al. | 427/96 |
| 5,993,553 A | * 11/1999 | Lim et al. | 118/410 |

FOREIGN PATENT DOCUMENTS

| | | |
|---|---|---|
| JP | 6165435 | 4/1986 |
| JP | 63156320 | 6/1988 |
| JP | 4118073 | 4/1992 |

* cited by examiner

Primary Examiner—Richard Crispino
Assistant Examiner—J. A. Lorengo
(74) Attorney, Agent, or Firm—Carrier, Blackman & Associates, P.C.; Joseph P. Carrier; William D. Blackman

(57) ABSTRACT

A liquid chemical treatment apparatus includes a coating apparatus for applying a coating liquid such as resist onto the surface of a substantially planar substrate such as a glass substrate. The coating apparatus includes a nozzle with an elongate injection outlet such as a slit with a width substantially the same as that of the substrate, and a liquid circulating passage connected to the nozzle for supplying the coating liquid to the nozzle. Mechanisms are provided with the circulating passage and the nozzle to remove air from the liquid, and to maintain the circulating liquid at a substantially constant temperature and a substantially constant flow rate. When performing a coating operation with the coating liquid, a flow amount thereof is increased up to 1,500 though 3,000 ml/min, from a condition under which the liquid is prevented from dropping from the slit-like injection outlet while circulating within the circulating passage at a flow rate of 500 through 700 ml/min, for example, by closing a valve or by means of a pump 35 included with the passage. The liquid output from the slit-like injection outlet 4a takes on the form of a curtain to be applied over substantially the entire surface of the substrate, without any drops of the coating liquid remaining within the nozzle after the coating operation.

16 Claims, 8 Drawing Sheets

CHEMICAL LIQUID TREATMENT APPARATUS

BACKGROUND OF THE INVENTION

1. Field of the Invention

The present invention relates to a chemical liquid treatment apparatus for applying a liquid chemical coating, such as a resist liquid, a developing fluid, or a rinsing liquid or the like, upon a surface of a platelike material to be treated, for example, a glass substrate or a semiconductor wafer or the like.

2. Description of Related Art

Conventionally, for decreasing the amount of an application liquid such as resist liquid or the like which is applied onto a surface of a plate-like material to be treated, such as a semiconductor wafer or a glass substrate or the like, it has been the practice to inject the application liquid from a nozzle opening in a form of a slit, as is disclosed for example in Japanese Laid-open Patent No. Sho 61-65435 (1986), No. Sho 63-156320 (1988), and No. Hei 4-118073 (1992).

In more detail, in Japanese Laid-open Patent No. Sho 61-65435 (1986), there is disclosed a nozzle provided with a flat liquid injection opening, which is directed downward and is perpendicular or normal to a moving direction of a substrate, wherein a treatment liquid is applied like a film coming across the path of the substrate so that the substrate being transferred passes through the film of the treatment liquid while the substrate is attached upon a rotating chuck and is rotated thereby. The substrate, therefore, is treated with the treatment liquid being spread from the slit nozzle positioned thereabove.

In Japanese Laid-open Patent No. Sho 63-156320 (1988), it Is disclosed that a substrate is rotated and a thin film of light-sensitive resist material is formed thereon after the resist liquid is supplied onto the substrate from an opening having a line-like shape, which is part of a resist supplying means (i.e., nozzle).

Further, in Japanese Laid-open Patent No. Hei 4-118073 (1992), in the same manner as mentioned in the conventional art above, it is disclosed that, after a coating liquid is applied upon a substrate through a head having a nozzle opening in the shape of a slit (or slot), the thickness of the applied film is adjusted by spin-type adjustment apparatus for adjusting the thickness thereof.

According to the construction disclosed in every one of the conventional art documents mentioned above, however, the nozzle is connected at a tip of a supply conduit used for feeding the application liquid to be applied, and therefore, the application liquid is injected from the nozzle by opening a valve located on the supply conduit itself, while the injecting of the application liquid from the nozzle is stopped by closing the valve at the supply conduit.

As is mentioned above, in the conventional art, though the injection of the application liquid is stopped by closing the valve located on the supply conduit, there remains an amount of application liquid still within the nozzle. As a result, the remaining application liquid tends to leak from the nozzle, and sometimes drops or falls out of the nozzle even after the closing of the valve, which can cause problems.

Further, if the application liquid leaks from the opening of the nozzle, it is difficult to maintain the thickness of the film applied to a substrate at a constant value, since the amount of application liquid that is applied at the next application cycle is variably increased depending on the amount of liquid that was trapped in the nozzle when the valve was last shut. Therefore, in the conventional art, ordinarily, application of the liquid to a substrate is once again started after necessarily discharging the liquid remaining within the nozzle, which is a waste of the application liquid, and this is a large disadvantage.

SUMMARY OF THE INVENTION

In accordance with the present invention, for resolving the drawbacks in the conventional art mentioned above, there is provided a chemical liquid treatment apparatus, comprising a coating apparatus for applying a coating liquid, which has a nozzle for applying the coating liquid upon a surface of a plate-like material to be treated, in a predetermined width, wherein the nozzle is connected to a circulating passage for supplying the coating liquid to the nozzle.

When providing the nozzle connected to a circulating passage for supplying the coating liquid, for the purpose of prohibiting generation of bubbles in the liquid due to the supply to and the discharge from the nozzle of the coating liquid, it is preferable to make the cross-sectional shape of the fluid passage formed in the nozzle substantially equal to those of the supply conduit (including any tubes, etc.) and of the discharge conduit (including any tubes, etc.) for supplying the coating liquid to be applied, so as to remove any steps or gradients between them.

Further, it is preferable for the fluid passage for the coating liquid in the nozzle to be formed straight and to be substantially constant in cross-sectional area thereof over substantially its entire length.

Moreover, it is also preferable to provide an air extracting cell and a temperature adjuster in the circulating passage, and to connect an another supply conduit for the coating liquid to the circulating passage.

DESCRIPTION OF THE PREFERRED EMBODIMENTS

Hereinafter, detailed explanation of the preferred embodiments according to the present invention will be given by referring to the attached drawings. Here, FIG. 1 shows an overall perspective view of a coating apparatus according to the present invention, and FIG. 2 shows a cross-sectional, elevational view of the coating apparatus according to the present invention, wherein rails 2, 2 are provided at both sides of a coating unit 1 of the rotary-cup type, between which a frame 3 of the gate type is engaged movably, and to the frame 3 of the gate type, there is attached a nozzle 4.

Figure 1:
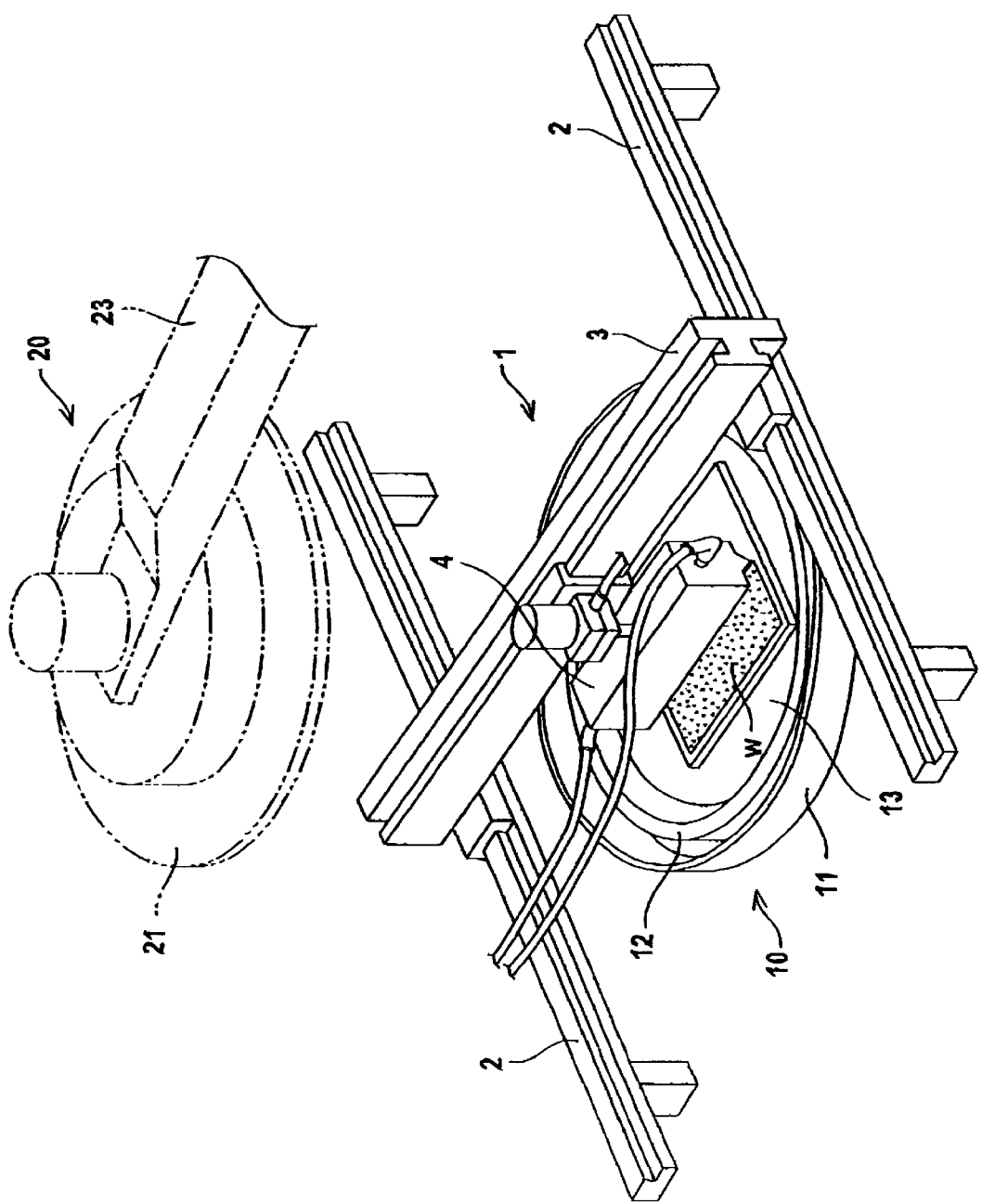
FIG. 1 shows an overall perspective view of a chemical liquid treatment apparatus according to the present invention with a lid portion thereof shown in broken lines.
Figure 2:
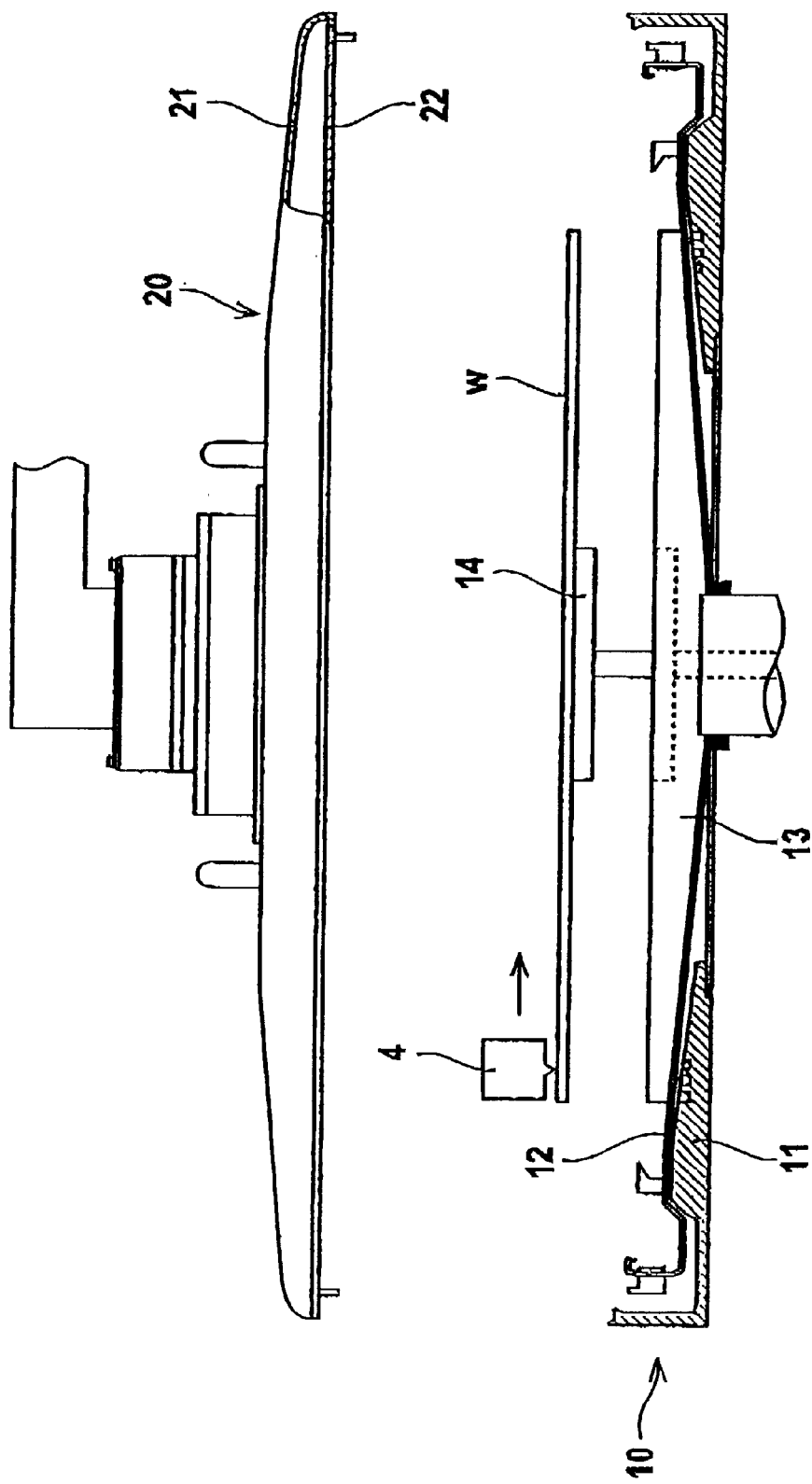
FIG. 2 shows a side elevational, cross-sectional view of the chemical liquid treatment apparatus according to the present invention.

However, since the present invention broadly relates to a chemical liquid treatment apparatus, the form of the apparatus should, therefore, not be restricted only to the coating apparatus as is shown in FIGS. 1 and 2.

Further, the coating unit 1 of the rotary-cup type is constructed with a lower portion 10 and an upper portion 20. The lower portion 10 comprises an outer cup 11 which is fixed on a base, and an inner cup 12 which is rotated by a spinner provided in the outer cup 11. Inside of the inner cup 12, there is provided a mounting table 13 which rotates with the inner cup 12 as a unit, and at the center of this mounting table 13 there is provided a sub-table 14. This sub-table 14 can move upward and downward (i.e., elevate) independently, and it delivers or receives a glass substrate W (a plate-like material to be treated) at an upper position thereof, and it comes to be on the same plane as the surface of the mounting table 13 at a lower position thereof.

In addition, the upper portion 20 comprises an outer cup cover 21 for blocking and sealing at the periphery (edge) of the outer cup 11 at a position when the upper portion 20 is raised somewhat, and an inner cup cover 22 for blocking and sealing at the periphery (edge) of the inner cup 12 at a position when the portion 20 is lowered. The outer cup cover 21 is supported by an arm 23, and the inner cup cover 22 is supported rotatably, independent from the outer cup cover 21.

Figure 3:
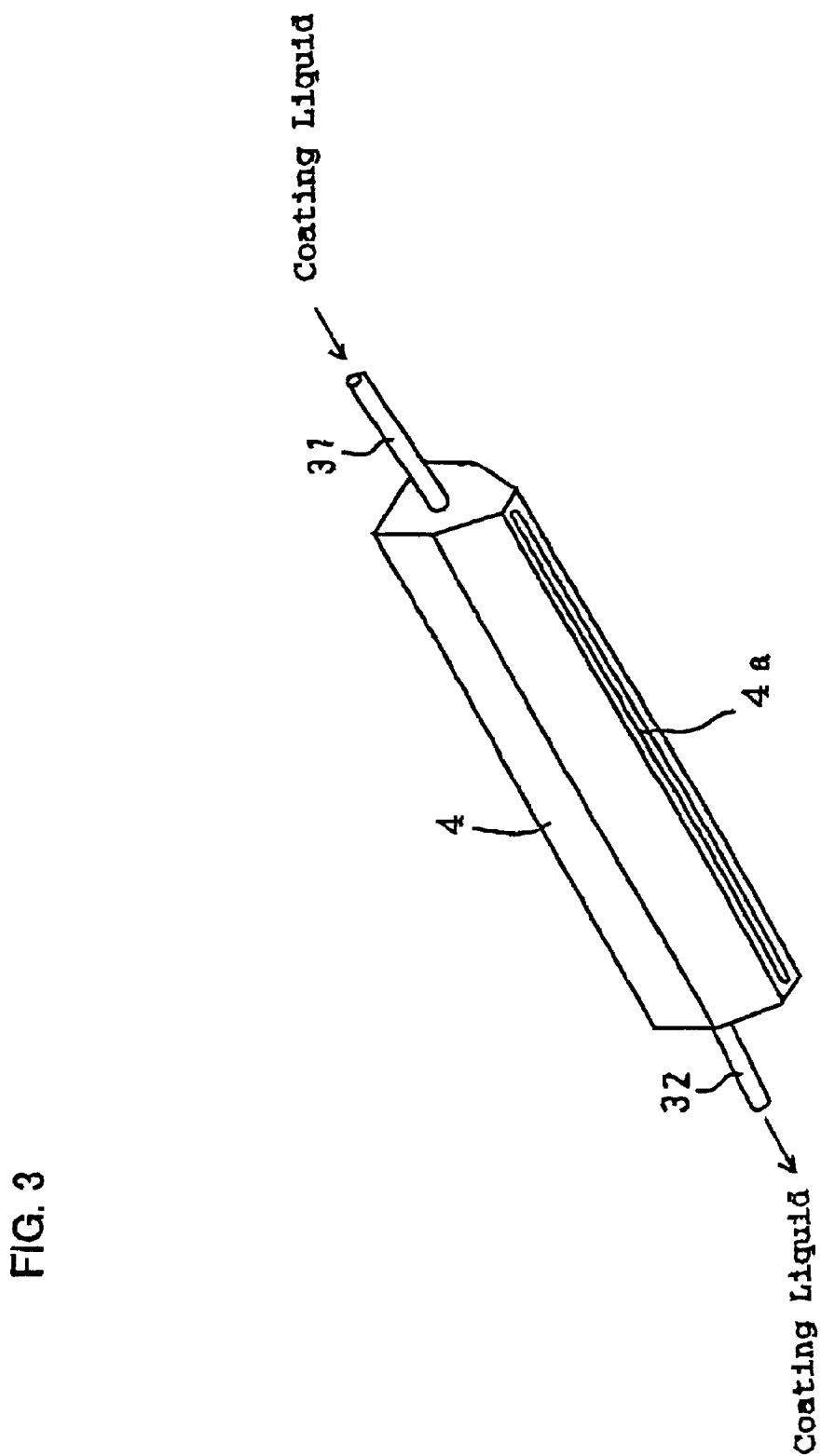
FIG. 3 shows a perspective view of the nozzle of the apparatus of FIG. 1 shown from below.

Further, the nozzle 4 comprises an injection outlet 4a having a slit-like shape, and which is a little bit shorter in length than the width of the glass substrate W, as shown in FIGS. 1–3. At one end thereof the nozzle 4 is connected to a supply conduit 31 for the coating liquid, and at the other end thereof it is connected to a discharge conduit 32 for the coating liquid. However, the injection outlet 4a may be formed otherwise than shown, e. g., from a plurality of a circular bores or holes aligned in a longitudinal direction thereof.

Figure 4:
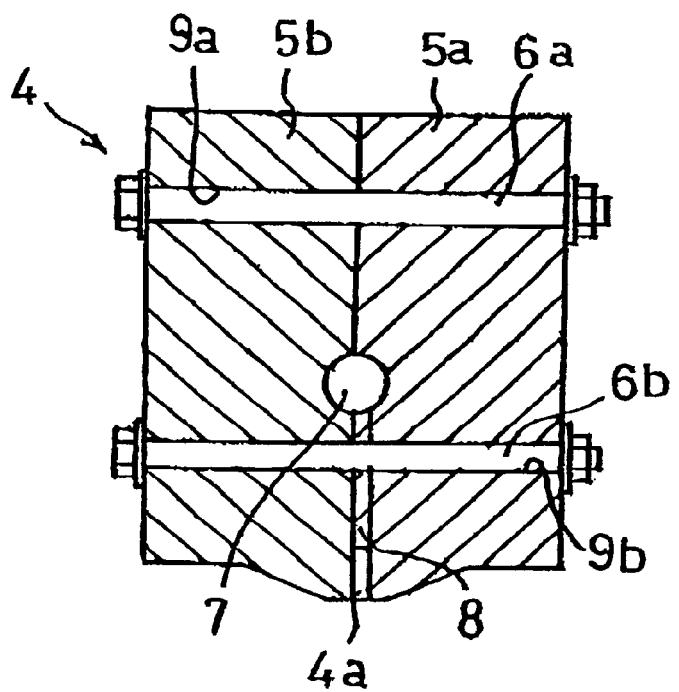
FIG. 4 shows a vertical cross-sectional view of the nozzle shown in FIG. 3.

The nozzle 4 is constructed, as shown in FIG. 4, with a left-hand side half body 5a and a right-hand side half body 5b which are connected by means of bolts 6a, 6b.

At the jointing surface of each of the half bodies 5a, 5b, there is formed a recess portion for forming a fluid passage 7, and in the half body 5a there is formed a recess portion for forming the slit-like injection outlet 4a mentioned above. However, the fluid passage 7 communicates with the slit-like injection outlet 4a, and in the slit-like injection outlet 4a there are formed plural projection portions 8 for setting the width of each portion of the injection outlet 4a or in each of the injection outlets. Note that there may be one or more of the outlets 4a.

Figure 5:
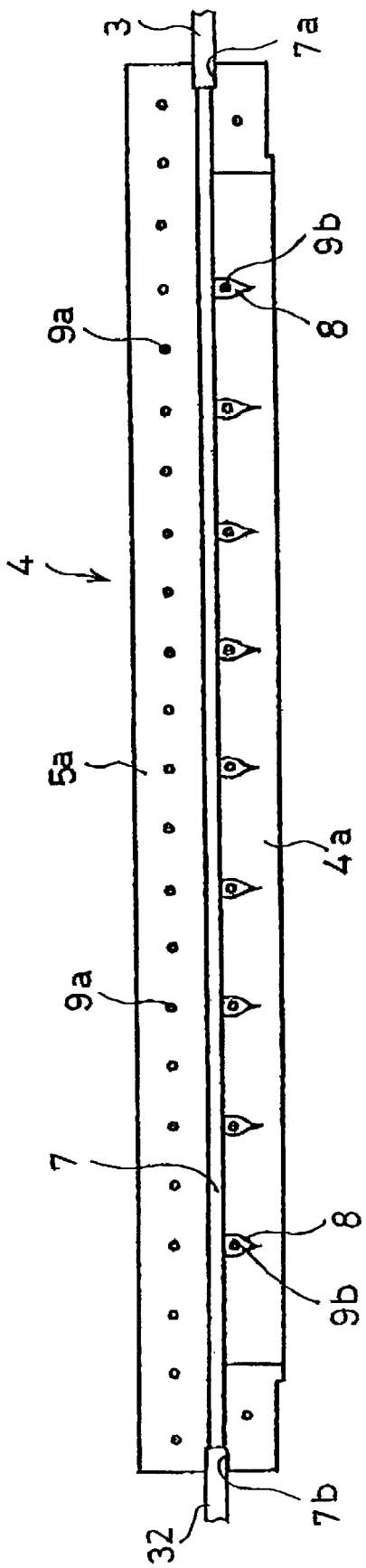
FIG. 5 shows a front elevational view of a half body of the nozzle.

Each of the projection portion 8 mentioned above is shaped approximately like a spindle, as shown in FIG. 5, seen from a front side thereof, and therefore, the coating liquid from the fluid passage 7 can flow down through the slit-like injection outlet 4a while experiencing as little resistance therefrom as possible.

Further, in each half body 5a, 5b, an insertion bore 9a for the bolt 6a mentioned above is formed in an upper part of the recess portion forming the fluid passage 7, and an insertion bore 9b for the bolt 6b is formed in a part below the fluid passage 7. In particular, the insertion bore 9b is opened in the part of the projection portion 8 mentioned above, and thereby it is so constructed that the coating liquid does not come into contact with the bolt 6b. Further, the insertion bore 9b may be opened beside the projection portion 8.

Figure 6:
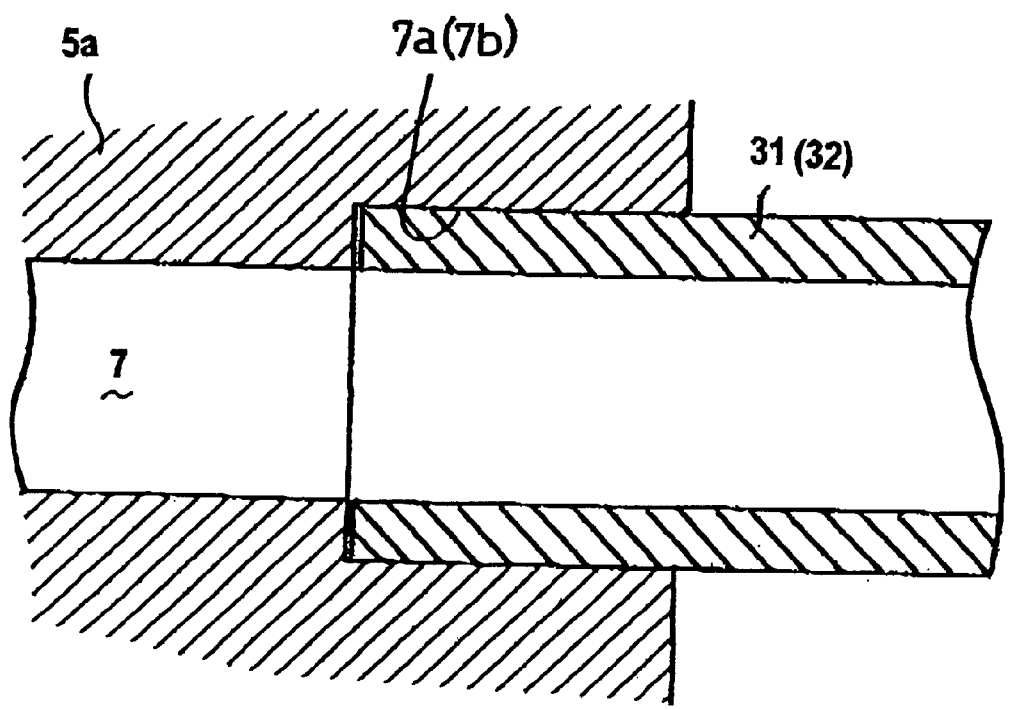
FIG. 6 shows an enlarged view of principal portions of FIG. 5.

Further, at one end of the straight fluid passage 7 which is formed in the nozzle 4 there is formed a supply opening 7a into which the supply conduit 31 is inserted, and at the other end thereof there is formed a discharge opening 7b into which the discharge conduit 32 is inserted. The supply opening 7a and discharge opening 7b are formed to be a little bit larger than the fluid passage 7 in the diameters thereof, and are so arranged that the cross-sectional shape of the fluid passage of the supply opening 7a and the discharge opening 7b come to be almost equal to that of the fluid passage 7, as shown in FIG. 6, under the condition that the supply conduit 31 is Inserted into the supply opening 7a and the discharge conduit 32 Into the discharge opening 7b, respectively.

With such a construction, no step is formed at the junctures between the supply conduit 31, the discharge conduit 32 and the fluid passage 7, thereby prohibiting the generation of bubbles due to turbid flow of the coating liquid.

Further, instead of the example mentioned above, the supply conduit 31 and the discharge conduit 32 may be connected with the fluid passage 7, at the ends thereof, in the shape of the letter "L".

Figure 7:
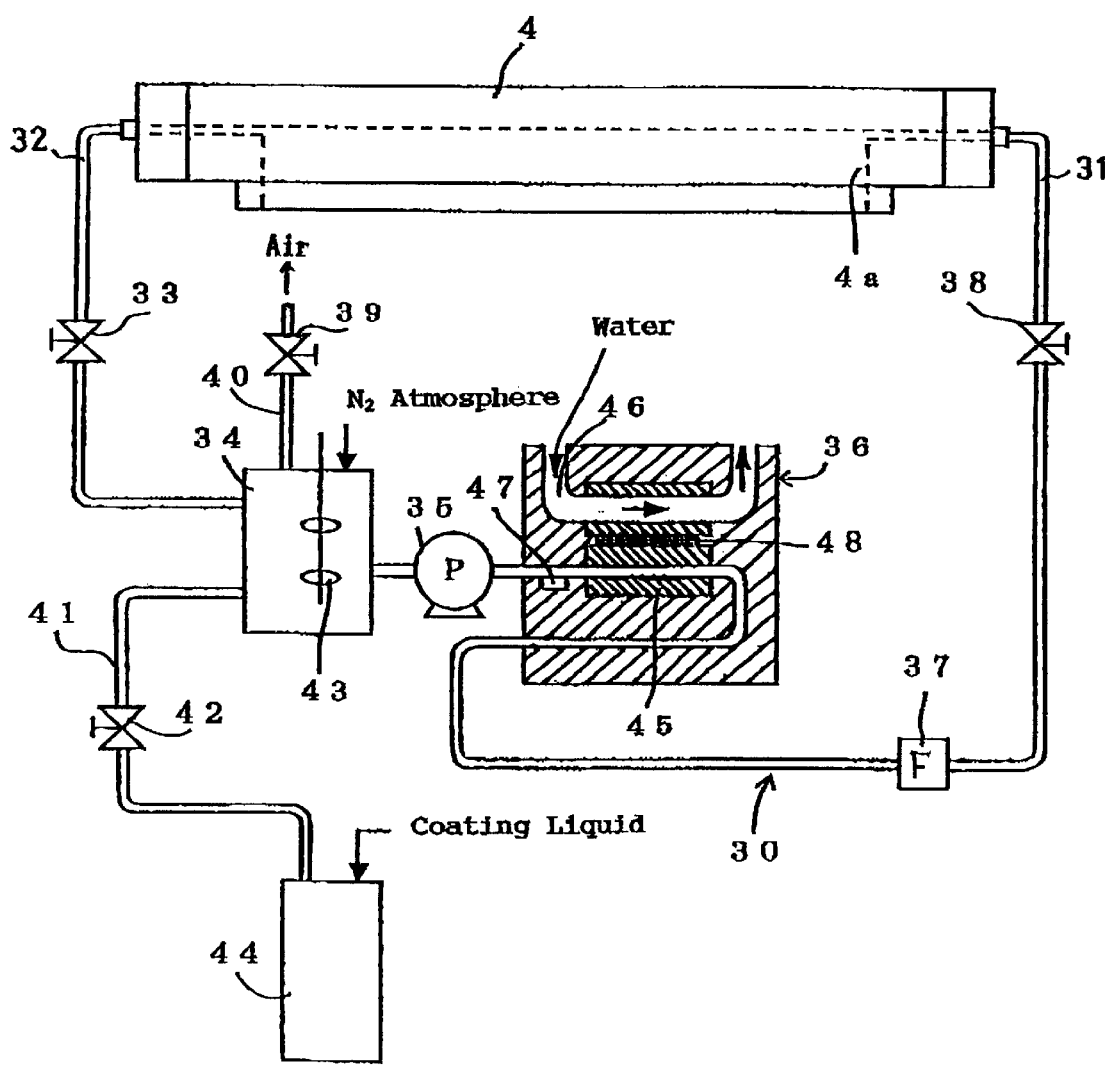
FIG. 7 is a general schematic view for showing a liquid circulating passage of the chemical liquid treatment apparatus according to the present invention.

FIG. 7 shows a construction according to the invention in which the nozzle 4 is provided connected to circulating passage 30 for the coating liquid. As mentioned above, at one end of the nozzle 4 there is connected the supply conduit 31 for the coating liquid, forming a part of the circulating passage 30, and at the other end of the nozzle 4, there is connected the discharge conduit 32 for the coating liquid, also forming a part of the circulating passage 30. Furthermore, connected to the circulating passage 30, there are provided a valve 33, an air extraction tank 34, a pump 35, a temperature adjuster 36, a filter 37, and a valve 38.

In the air extraction tank 34, there is provided an air extraction conduit 40 equipped with a valve 39, and to the air extraction tank 34 there is connected a supply pipe 41 for the coating liquid on which a valve 42 is also provided.

Therefore, when it is detected that the amount of the coating liquid is less than a predetermined value within the air extraction tank 34, by means of a liquid surface sensor 43 which is provided in the air extraction tank 34, for example the valve 42 is automatically opened and the coating liquid in a tank 44 is supplied into the air extraction tank 34 through the supply pipe 41.

In addition, in the temperature adjuster 36, there are provided a heater 45 for heating the coating liquid within the circulating passage 30 and a passage 46 for cooling water so as to cool the coating liquid. The temperature of the coating liquid flowing within the circulating passage 30 is measured by a sensor 47, and the amount of water flowing within the cooling water passage 46 is controlled by a controlling device 48 on the basis of the value measured therewith, so as to maintain the temperature of the coating liquid at a constant value. However, the structure of the temperature adjuster 36 is not restricted to only the embodiment shown in the figure and can be constructed by any arbitrary, appropriate manner. Further, the position of the filter 37 may be located at a position somewhere between the pump 35 and the temperature adjuster 36.

In the above, arrangement according to the invention though depending on the size of the slit-like injection outlet 4a, in the case of applying a developing fluid, for example, by circulating the developing fluid and increasing the flow amount thereof from 500 through 700 ml/min under the condition that the developing fluid does not drop or leak from the slit-like injection outlet 4a, up to 1,500 through 3,000 ml/min, through closing or narrowing the valve 33, the developing fluid attains the form of a curtain or extended spray to be applied over almost all the entire surface of the glass substrate W.

After applying the developing fluid over almost all the surface of the glass substrate W, by turning the valve 33 back to the original condition, or by otherwise decreasing the flow rate amount back to the original amount, the flow of the developing fluid from the slit-like injection outlet 4a is stopped, and the developing fluid begins to flow out into a side of the valve 33, and thereby the developing fluid is sucked from the slit-like injection outlet 4a into the inside of the nozzle by a vacuum effect.

Figure 8:
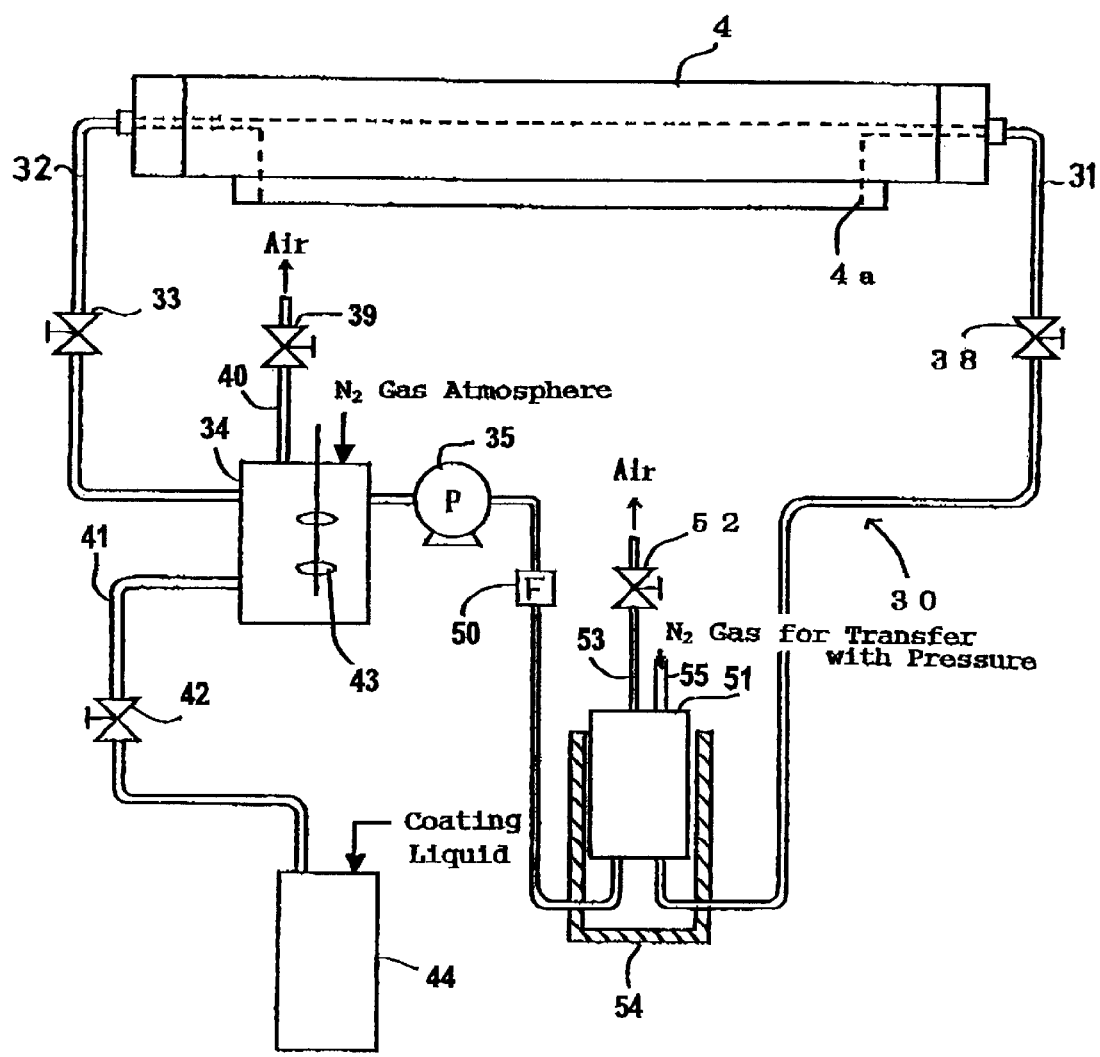
FIG. 8 shows an another embodiment of the liquid circulating passage.

FIG. 8 shows another embodiment of the nozzle circulating passage according to the invention, wherein the same elements shown in the embodiment of FIG. 7 are indicated by the same reference numerals, and therefore the explanation thereof will be omitted here.

In this embodiment, a second air extraction tank 51 is provided at a downstream side of the pump 35 with a filter 50 therebetween. In this second air extraction tank 51, there is provided an air extraction pipe 53 comprising a valve 52, and outside of the air extraction tank 51 there is positioned a temperature adjuster 54, and further on an upper surface of the air extraction tank 51, there is connected a nitrogen ($N_2$) gas supply conduit 55 for transferring the coating liquid under pressure.

In this embodiment, not the pump but the pressure of the nitrogen ($N_2$) gas is used as a driving source for transferring the coating liquid to the slit-like injection outlet 4a. Namely, in the case of supplying the coating liquid, by closing the valves 33, 52 from the condition in which the coating liquid is circulated and by stopping the pump 35 as well, the nitrogen ($N_2$) gas is sent into the air extraction tank 51. Then, with the nitrogen ($N_2$) gas at a pressure of 1.0 through 2.0 $kg/cm^2$, the coating liquid is sent through the circulating passage 30 and the valve 38 into the slit-like injection outlet 4a, thereby performing coating in the form of the curtain upon the surface of the glass substrate W or other object to be coated. As a result, in the same manner as mentioned above, a similar result can be also obtained even under the condition that no valve like valve 38 is provided.

Also, the vacuum effect is again, used as an effective measure to prevent the falling of any drops of the coating liquid remaining within the nozzle 4 after an application operation therewith.

As is fully described above, since there is provided the elongate nozzle connected to the circulating passage for the coating liquid, for applying the coating liquid with a predetermined width upon the surface of the plate-like material to be treated, by operation of only the valve provided in the circulating passage, a vacuum effect is applied along the whole length of the injection outlet of the nozzle, thereby inhibiting the unintended falling or leaking of any drops of the coating liquid from the nozzle.

Further, the cross-sectional shape for the fluid passage of the coating liquid, which is formed in the nozzle, is substantially the same as that of the supply conduit and of the discharge conduit of the coating liquid, and therefore, no step is formed at the juncture between the conduits and the fluid passage, thereby inhibiting the generation of bubbles or turbid flow therein.

Furthermore, although in the conventional art after each coating operation it has been necessary to move the nozzle away from the position just above the plate-like material to be treated so as to discharge any excess coating liquid from the tip of the nozzle, and then to move the nozzle must back to the position just above the plate-like material so as to again apply the coating liquid, there is no such necessity in the present invention described above. This results in effective usage of the coating liquid as well as greater simplicity in the application control thereof.

Moreover, with provision of the air extraction tank connected to the circulating passage, bubbles rarely occur within the nozzle, and also with provision of the temperature adjuster connected to the circulating passage, it is possible to maintain the viscosity of the coating liquid to be injected from the nozzle at a constant value.

In particular, since the coating liquid, which is once adjusted for temperature by the temperature adjuster, is always circulating, it can, therefore, be injected from the nozzle while maintaining a constant temperature thereof.

Furthermore, by connecting the coating liquid supply pipe to the circulating passage, or more specifically, to the air extraction tank, it is possible to have the coating liquid always circulate in the circulating passage at a constant flow rate.

Although there have been described what are at present considered to be the preferred embodiments of the invention, it will be understood that variations and modifications may be made thereto without departing from the gist, spirit, or essence of the invention. The scope of the invention is indicated by the appended claims.

What is claimed is:

1. A chemical liquid treatment apparatus comprising a coating apparatus for applying a coating liquid, which has a nozzle disposed above a plate-like material for applying the coating liquid upon an upper surface of said plate-like material to be treated, in a predetermined width, said nozzle is connected to a circulating passage for supplying the coating liquid to the nozzle, and said apparatus continuously circulates said coating liquid through said circulating passage whether or not said coating liquid is being applied from the nozzle.

2. A chemical liquid treatment apparatus as described in claim 1, wherein a fluid passage for the coating liquid is formed within said nozzle, one end of said fluid passage being formed with a supply opening into which a supply conduit is inserted, and another end of said fluid passage being formed with a discharge opening into which a discharge conduit is inserted, a cross-sectional shape and size of said fluid passage at a portion continuous to said supply opening is substantially the same as that of the supply conduit and a cross-sectional shape and size of said fluid passage at a portion continuous to said discharge opening is substantially the same as that of the supply conduit.

3. A chemical liquid treatment apparatus as described in claim 2, wherein, said fluid passage for the coating liquid formed in said nozzle is substantially straight and is also substantially constant in cross-sectional area thereof from a beginning through an end thereof.

4. A chemical liquid treatment apparatus as described in claim 3, wherein said coating apparatus further includes an air extracting cell and a temperature adjuster provided in said circulating passage.

5. A chemical liquid treatment apparatus as described in claim 4, wherein in said coating apparatus, to said air extracting cell there is connected another conduit for supplying additional coating liquid to said circulating passage, such that the coating liquid circulates at a constant flow rate in the circulating passage.

6. A chemical liquid treatment apparatus as described in claim 1, further including means for extracting air from the coating liquid as it is circulated through the circulating passage, and means for adjusting the temperature of the coating liquid as it is circulated through the circulating passage.

7. A chemical liquid treatment apparatus as described in claim 1, further including means for maintaining a constant flow rate of the coating liquid as it is circulated through the circulating passage.

8. A chemical liquid treatment apparatus as described in claim 1, wherein said nozzle has an elongate liquid ejection outlet, and said apparatus further includes means operatively associated with said nozzle and said circulating passage for preventing unintended leakage of the coating liquid from the liquid injection outlet.

9. A chemical liquid treatment apparatus as described in claim 8, wherein said leakage preventing means includes means for creating a vacuum effect within the liquid ejection outlet when the apparatus is not performing a coating operation by circulating the coating liquid in said circulating passage at a flow rate lower that when the coating liquid is being applied from said nozzle.

10. A chemical liquid treatment apparatus as described in claim 8, further including means for extracting air from the coating liquid as it is circulated through the circulating passage, and means for adjusting the temperature of the coating liquid as it is circulated through the circulating passage.

11. A chemical liquid treatment apparatus as described in claim 8, further including means for maintaining a constant flow rate of the coating liquid as it is circulated through the circulating passage.

12. A chemical liquid treatment apparatus as described in claim 8, wherein said liquid ejection outlet has a longitudinal dimension substantially as long as said predetermined width.

13. A chemical liquid treatment apparatus as described in claim 1, wherein said nozzle includes a fluid passage having ends communicating with said communication passage and an elongate liquid ejection outlet, communicating with said fluid passage, for discharging the coating liquid therefrom, and said apparatus further includes means operatively associated with said nozzle and said circulating passage for creating a vacuum effect within the liquid ejection outlet when the apparatus is not performing a coating operation.

14. A chemical liquid treatment apparatus as described in claim 1, wherein said nozzle includes a pair of half bodies joined together, a fluid passage having ends communicating with said communication passage, a slit-like injection outlet having one end communicating with said fluid passage and another end for discharging the coating liquid therefrom, and means for setting a width of said slit-like injection outlet.

15. A chemical liquid treatment apparatus as described in claim 14, wherein said width setting means includes a plurality of projecting portions spaced from each other and extending within said slit-like injection outlet between said pair of half bodies.

16. A chemical liquid treatment apparatus as described in claim 1, wherein said nozzle is adapted to apply the coating liquid to the surface of the plate-like material in the form of an extended spray when the coating liquid circulates through the circulating passage at a first flow rate, and said nozzle and said circulating passage are adapted to create a vacuum effect within an injection outlet of the nozzle when the coating liquid circulates through said circulating passage at a second flow rate lower than said first flow rate.

* * * * *

UNITED STATES PATENT AND TRADEMARK OFFICE
CERTIFICATE OF CORRECTION

PATENT NO. : 6,423,139 B1
DATED : July 23, 2002
INVENTOR(S) : Futoshi Shimai, Koichi Nagasawa and Junji Kutsuzawa It is certified that error appears in the above-identified patent and that said Letters Patent is hereby corrected as shown below:

Title page,
Item [57], ABSTRACT,
Line 19, delete "4$a$".

Column 1,
Line 32, change "Is" to -- is --.

Column 2,
Line 34, change "an another" to -- another --.
Line 36, after "invention" insert a comma.
Line 57, change "an another" to -- another --.

Column 3,
Line 38, change "plurality of a" to -- plurality of --.
Line 55, change "portion" to -- portions --.

Column 4,
Line 10, change "shape" to -- shapes --.
Line 11, change "passage" to -- passages --.
Line 14, change "Inserted" to -- inserted --.
Line 15, change "Into" to -- into --.
Line 26, before "circulating" insert -- a --.
Line 43, after "example" insert a comma.
Line 62, after "above" delete the comma; after "invention" insert a comma.

Column 5,
Line 9, delete "amount".
Line 45, before "again" insert a comma.
Line 58, change "for the fluid passage of" to -- of the fluid passage for --.
Line 62, change "juncture" to -- junctures --.

UNITED STATES PATENT AND TRADEMARK OFFICE
CERTIFICATE OF CORRECTION

PATENT NO. : 6,423,139 B1
DATED : July 23, 2002
INVENTOR(S) : Futoshi Shimai, Koichi Nagasawa and Junji Kutsuzawa It is certified that error appears in the above-identified patent and that said Letters Patent is hereby corrected as shown below:

Column 6,
Line 2, delete "must".
Line 52, after "wherein" delete the comma.
Line 62, after "another" insert -- supply --.

Column 7,
Line 20, change "that" to -- than --.

Signed and Sealed this

Eleventh Day of February, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,423,139 B1 Page 1 of 1
APPLICATION NO. : 09/153590
DATED : July 23, 2002
INVENTOR(S) : Shimai et al.

It is certified that error appears in the above-identified patent and that said Letters Patent is hereby corrected as shown below:

Column 1,
Line 34, change "Is" to -- is --.

Column 3,
Line 55, change "portion" to -- portions --.

Column 4
Line 10, change "shape" to -- shapes --.
Line 11, change "passage" to -- passages --.
Line 14, change "Inserted" to -- inserted --.
Line 15, change "Into" to -- into --.
Line 26, before "circulating" insert -- a --.

Column 5,
Line 9, delete "amount".
Line 62, change "juncture" to -- junctures --.

Signed and Sealed this

Twenty-second Day of August, 2006

JON W. DUDAS
*Director of the United States Patent and Trademark Office*

UNITED STATES PATENT AND TRADEMARK OFFICE
CERTIFICATE OF CORRECTION

PATENT NO. : 6,423,139 B1  Page 1 of 1
APPLICATION NO. : 09/153590
DATED : July 23, 2002
INVENTOR(S) : Futoshi Shimai, Koichi Nagasawa and Junji Kutsuzawa It is certified that error appears in the above-identified patent and that said Letters Patent is hereby corrected as shown below:

Title Page:
In the "(57)  ABSTRACT", 19th line, delete "$4a$".

Column 2:
Line 34, change "an another" to --another--.
Line numbered between 39 and 40, after "invention" insert a comma.
Line 57, change "an another" to --another--.

Column 3:
Line numbered between 38 and 39, change "plurality of a" to --plurality of--.

Column 4:
Line 43, after "example" insert a comma.
Line 62, after "above" delete the comma; after "invention" insert a comma.

Column 5:
Line 45, before "again" insert a comma.
Line 58, change "for the fluid passage of" to --of the fluid passage for--.

Column 6:
Line 2, delete "must".

Signed and Sealed this

Second Day of October, 2007

JON W. DUDAS
*Director of the United States Patent and Trademark Office*